US012113531B2

(12) United States Patent
Guo et al.

(10) Patent No.: US 12,113,531 B2
(45) Date of Patent: Oct. 8, 2024

(54) LAYOUT STRUCTURE AND METHOD FOR FABRICATING SAME

(71) Applicant: CHANGXIN MEMORY TECHNOLOGIES, INC., Hefei (CN)

(72) Inventors: Yingdong Guo, Hefei (CN); Jing Xu, Hefei (CN); Wei Jiang, Hefei (CN); Xue Shan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 15 days.

(21) Appl. No.: 18/155,759

(22) Filed: Jan. 18, 2023

(65) Prior Publication Data

US 2023/0421157 A1 Dec. 28, 2023

Related U.S. Application Data

(63) Continuation of application No. PCT/CN2022/105464, filed on Jul. 13, 2022.

(30) Foreign Application Priority Data

Jun. 24, 2022 (CN) .......................... 202210726154.3

(51) Int. Cl.
  *H03K 21/02* (2006.01)
  *H05K 1/02* (2006.01)
  *H04B 1/04* (2006.01)

(52) U.S. Cl.
  CPC ........... *H03K 21/02* (2013.01); *H05K 1/0296* (2013.01); *H04B 1/04* (2013.01)

(58) Field of Classification Search
  CPC .... H03K 21/02; H05K 1/0296; H05K 1/0298; H05K 1/09; H05K 1/11; H04B 1/04
  See application file for complete search history.

(56) References Cited

U.S. PATENT DOCUMENTS

2008/0126566 A1 5/2008 Baumgartner et al.

FOREIGN PATENT DOCUMENTS

| CN | 101587509 A | 11/2009 |
|---|---|---|
| CN | 101800237 A | 8/2010 |

(Continued)

*Primary Examiner* — Jung Kim
(74) *Attorney, Agent, or Firm* — Kilpatrick Townsend & Stockton LLP

(57) ABSTRACT

A layout structure and a method for fabricating the same. A frequency divider pattern layer includes a first frequency divider region, a second frequency divider region, a third frequency divider region and a fourth frequency divider region arranged centrosymmetrically. A conductor pattern layer includes a first sub-conductor pattern layer and a second sub-conductor pattern layer stacked. The first sub-conductor pattern layer is configured to communicate the first frequency divider region with the second frequency divider region, and communicate the third frequency divider region with the fourth frequency divider region. The second sub-conductor pattern layer is configured to communicate the first frequency divider region with the fourth frequency divider region, and communicate the second frequency divider region with the third frequency divider region. The embodiments reduce a channel transmission difference between different frequency dividers in a frequency divider structure.

18 Claims, 4 Drawing Sheets

(56) References Cited

FOREIGN PATENT DOCUMENTS

| | | | | |
|---|---|---|---|---|
| CN | 103066995 | A | 4/2013 | |
| CN | 104980173 | B | 7/2018 | |
| CN | 109167598 | A | 1/2019 | |
| CN | 113657065 | A | 11/2021 | |
| CN | 114330208 | A * | 4/2022 | ........... G06F 30/392 |
| CN | 114330210 | A | 4/2022 | |

* cited by examiner

LAYOUT STRUCTURE AND METHOD FOR FABRICATING SAME

CROSS-REFERENCE TO RELATED APPLICATION

The present disclosure is a continuation of PCT/CN2022/105464, filed on Jul. 13, 2022, which claims priority to Chinese Patent Application No. 202210726154.3 titled "LAYOUT STRUCTURE AND METHOD FOR FABRICATING SAME" and filed to the State Intellectual Property Office on Jun. 24, 2022, the entire contents of which are incorporated herein by reference.

TECHNICAL FIELD

The present disclosure relates to the field of semiconductor manufacturing technology, and more particularly, to a layout structure and a method for fabricating the same.

BACKGROUND

With rapid development of integrated circuit technologies, the market has put forward higher requirements for integration of semiconductor products and accuracy of signal transmission. A plurality of circuit modules integrated in an integrated circuit require a clock signal to trigger a corresponding functional response. Generally, it is necessary to divide an input clock signal of the integrated circuit by means of a frequency divider to obtain a plurality of different frequency-divided clock signals, to provide the frequency-divided clock signals to corresponding functional modules.

A traditional frequency divider divides the input clock signal, and propagation speed of the plurality of frequency-divided signals obtained is still relatively fast. A channel transmission difference between the plurality of frequency-divided signals results in a difference between a speed of data transmission and a phase.

If the channel transmission difference between the plurality of frequency-divided signals can be reduced and efficiency and quality of signal transmission can be improved, performance and reliability of the integrated circuit are undoubtedly improved.

SUMMARY

According to various embodiments of the present disclosure, a layout structure and a method for fabricating the same are provided.

According to some embodiments, one aspect of the present disclosure provides a layout of a frequency divider, including a frequency divider pattern layer and a conductor pattern layer. The frequency divider pattern layer includes a first frequency divider region, a second frequency divider region, a third frequency divider region and a fourth frequency divider region arranged centrosymmetrically. The conductor pattern layer is formed on the frequency divider pattern layer, and the conductor pattern layer includes a first sub-conductor pattern layer and a second sub-conductor pattern layer stacked. The first sub-conductor pattern layer is configured to communicate the first frequency divider region with the second frequency divider region, and communicate the third frequency divider region with the fourth frequency divider region. The second sub-conductor pattern layer is configured to communicate the first frequency divider region with the fourth frequency divider region, and communicate the second frequency divider region with the third frequency divider region.

According to some embodiments, yet another aspect of the present disclosure provides a method for fabricating a layout of a frequency divider. The method includes: providing a frequency divider pattern layer, where the frequency divider pattern layer includes a first frequency divider region, a second frequency divider region, a third frequency divider region and a fourth frequency divider region arranged centrosymmetrically; and forming a conductor pattern layer on the frequency divider pattern layer, where the conductor pattern layer includes a first sub-conductor pattern layer and a second sub-conductor pattern layer stacked. The first sub-conductor pattern layer is configured to communicate the first frequency divider region with the second frequency divider region, and communicate the third frequency divider region with the fourth frequency divider region. The second sub-conductor pattern layer is configured to communicate the first frequency divider region with the fourth frequency divider region, and communicate the second frequency divider region with the third frequency divider region.

According to some embodiments, still another aspect of the present disclosure provides a method for fabricating the layout of the frequency divider. The method includes: providing a frequency divider pattern layer, where the frequency divider pattern layer includes a first frequency divider region, a second frequency divider region, a third frequency divider region and a fourth frequency divider region arranged centrosymmetrically; and forming a conductor pattern layer on the frequency divider pattern layer, where the conductor pattern layer includes a first sub-conductor pattern layer and a second sub-conductor pattern layer stacked. The first sub-conductor pattern layer is configured to communicate the first frequency divider region with the second frequency divider region, and communicate the third frequency divider region with the fourth frequency divider region. The second sub-conductor pattern layer is configured to communicate the first frequency divider region with the third frequency divider region, and communicate the second frequency divider region with the fourth frequency divider region.

BRIEF DESCRIPTION OF THE DRAWINGS

To describe the technical solutions of the embodiments of the present disclosure more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

Figure 1:
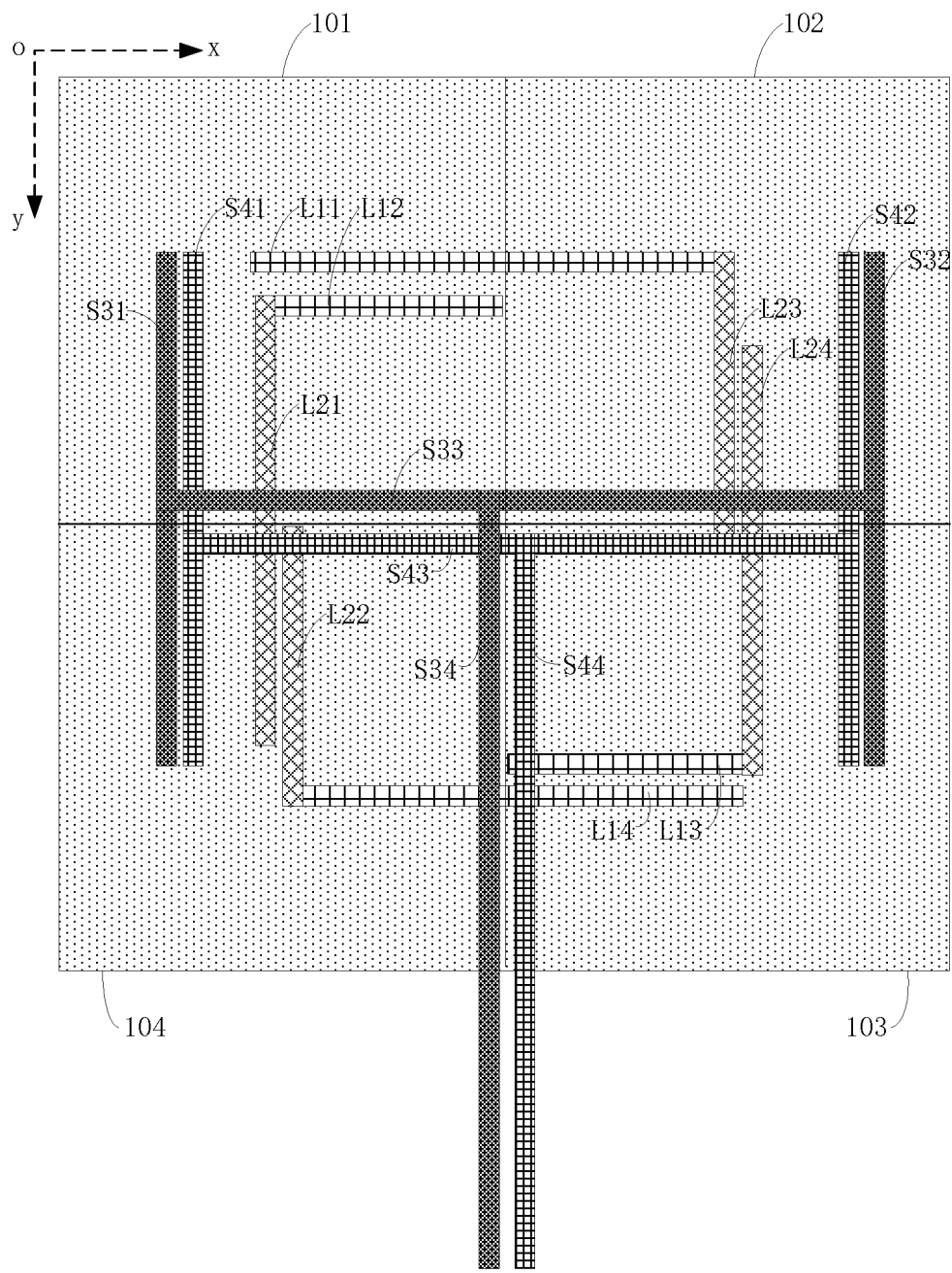
FIG. 1 is a schematic top view of a layout of a frequency divider according to an embodiment of the present disclosure.

For ease of understanding the present disclosure, the present disclosure will be described more fully hereinafter with reference to the accompanying drawings. Embodiments of the present disclosure are presented in the accompanying drawings. However, the present disclosure may be embodied in many different forms and should not be limited to the embodiments set forth herein. Rather, these embodiments are provided such that the present disclosure will be more thorough and complete.

Unless otherwise defined, all technical and scientific terms employed herein have the same meaning as commonly understood by one of ordinary skill in the art to which the present disclosure belongs. The terms employed in the specification of the present disclosure are merely for the purpose of describing some embodiments and are not intended for limiting the present disclosure. As used herein, the term "and/or" includes any and all combinations of one or more of the associated listed items.

It should be understood that when an element or layer is referred to as being "on", "connected to" or "coupled to" other elements or layers, it may be directly on, connected or coupled to the other elements or layers, or intervening elements or layers may be present. In contrast, when an element is referred to as being "directly on", "directly connected to" or "directly coupled to" other elements or layers, there are no intervening elements or layers present. It should be understood that although the terms first, second, third, etc. may be employed to describe various elements, components, regions, layers and/or sections, these elements, components, regions, layers and/or sections should not be limited by these terms. These terms are only employed to distinguish one element, component, region, layer or section from another element, component, region, layer or section. Therefore, without departing from the teachings of the present disclosure, a first element, component, region, layer or section discussed below may be represented as a second element, component, region, layer or section.

Spatially relative terms such as "below", "under", "lower", "beneath", "above", "upper" and the like may be used herein for ease of description to describe relationships between one element or feature as shown in the figures and another element(s) or feature(s). It should be understood that the spatially relative terms may be intended to encompass different orientations of the device in use or operation in addition to the orientation depicted in the figures. For example, if the device in the figures is turned over, elements or features described as "under", "beneath" or "below" other elements would then be oriented "above" the other elements or features. Thus, the exemplary term "under", "below" or "beneath" may encompass both an orientation of above and below. The device may be otherwise oriented (rotated 90 degrees or at other orientations) and the spatially relative descriptors used herein should be interpreted accordingly.

The terminology used herein is for the purpose of describing some embodiments only and is not intended to limit the present disclosure. As used herein, the singular forms of "a", "one" and "said/the" are also intended to include plural forms, unless the context clearly indicates otherwise. It should also be understood that the terms "comprising" and/or "including", when used in this specification, determine the presence of the described features, integers, steps, operations, elements and/or components, but do not preclude the presence or addition of one or more other features, integers, steps, operations, elements, components, and/or groups thereof. As used herein, the term "and/or" includes any and all combinations of related listed items.

Reference is made to FIG. 1 to FIG. 5. It should be noted that the illustrations provided in this embodiment merely illustrate the basic idea of the present disclosure in a schematic manner. Although only the components related to the present disclosure are shown in the drawings rather than the number, shape and dimensional drawing of components in actual implementation. The form, number and proportion of each component in actual implementation may be a random change, and the component layout form thereof may be more complicated.

Referring to FIG. 1, in an embodiment of the present disclosure, a layout structure is provided, which includes a frequency divider pattern layer and a conductor pattern layer. The frequency divider pattern layer includes a first frequency divider region 101, a second frequency divider region 102, a third frequency divider region 103 and a fourth frequency divider region 104 arranged centrosymmetrically. The conductor pattern layer is formed on the frequency divider pattern layer, and the conductor pattern layer includes a first sub-conductor pattern layer and a second sub-conductor pattern layer stacked. The first sub-conductor pattern layer is configured to communicate the first frequency divider region 101 with the second frequency divider region 102, and communicate the third frequency divider region 103 with the fourth frequency divider region 104. The second sub-conductor pattern layer is configured to communicate the first frequency divider region 101 with the fourth frequency divider region 104, and communicate the second frequency divider region 102 with the third frequency divider region 103.

Figure 2A:
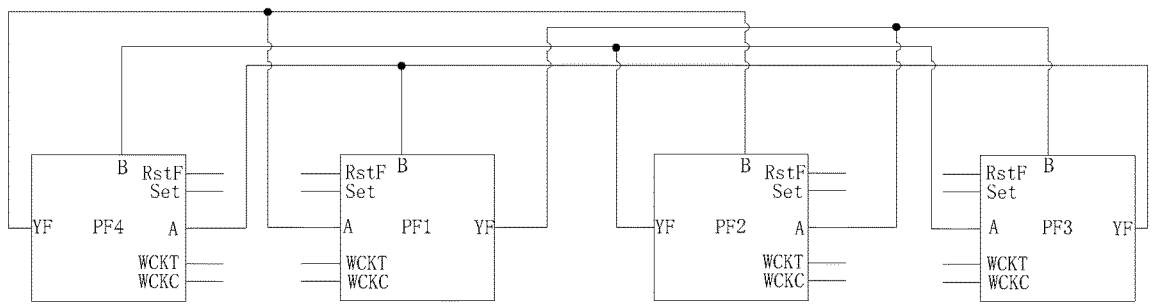
FIG. 2a is a schematic diagram showing a connection relationship between frequency dividers in a frequency divider structure fabricated for a layout of a frequency divider according to an embodiment of the present disclosure.
Figure 2B:
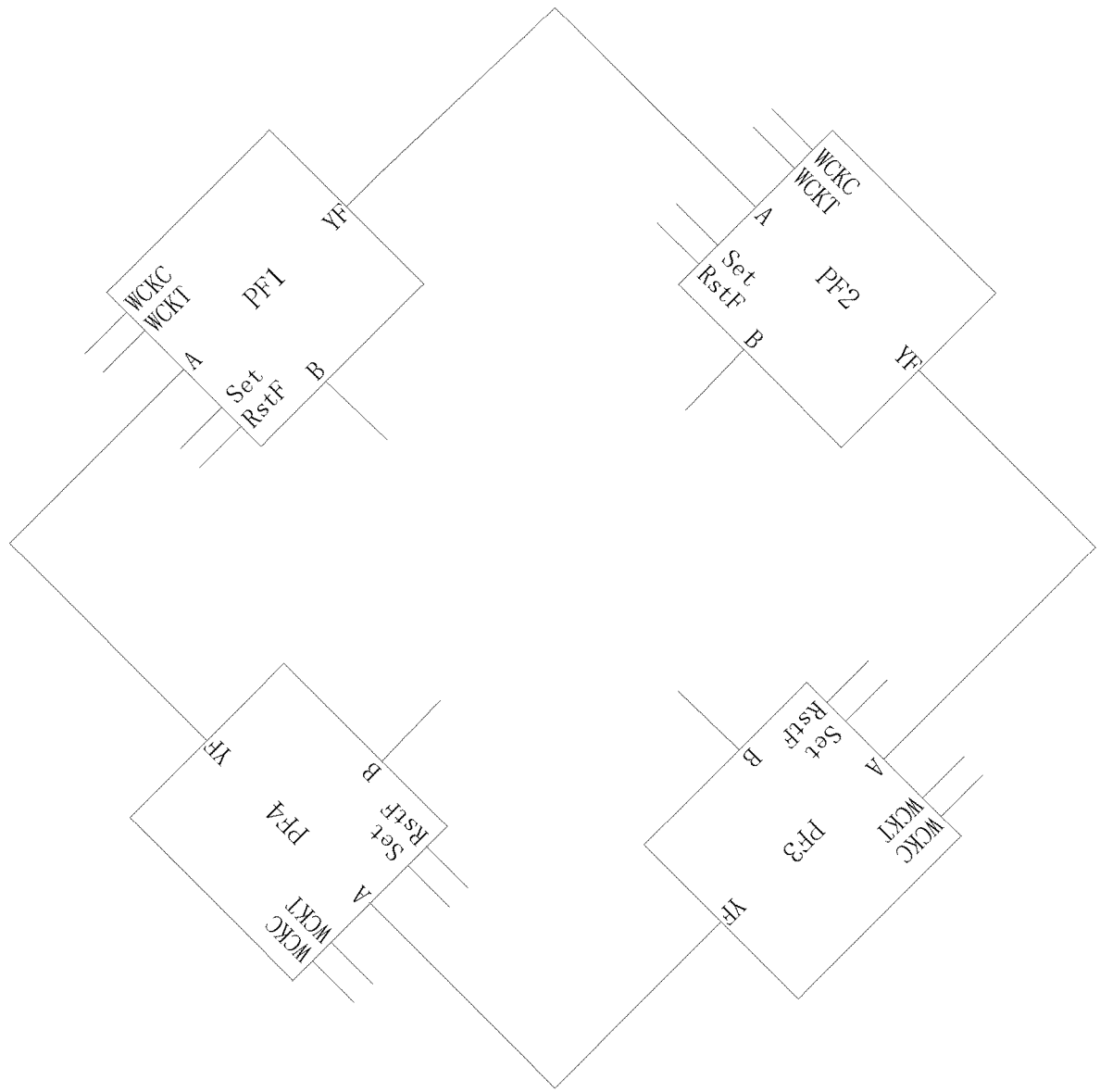
FIG. 2b is a schematic diagram of a layout of each frequency divider in a frequency divider structure fabricated for a layout of a frequency divider according to an embodiment of the present disclosure.

As an example, with continued reference to FIG. 1 to FIG. 2B, the first frequency divider region 101 may be provided to form a first frequency divider PF1, the second frequency divider region 102 may be provided to form a second frequency divider PF2, the third frequency divider region 103 may be provided to form a third frequency divider PF3, and the fourth frequency divider region 104 may be provided to form a fourth frequency divider PF4. By providing the first frequency divider region 101, the second frequency divider region 102, the third frequency divider region 103 and the fourth frequency divider region 104 to be arranged centrosymmetrically, it is convenient for the first frequency divider PF1, the second frequency divider PF2, the third frequency divider PF3 and the fourth frequency divider PF4 fabricated subsequently to be centrosymmetric, thereby reducing a channel difference among the first frequency divider PF1, the second frequency divider PF2, the third frequency divider PF3 and the fourth frequency divider PF4. By providing the first sub-conductor pattern layer to communicate the first frequency divider region 101 with the second frequency divider region 102, and to communicate the third frequency divider region 103 with the fourth frequency divider region 104, it is convenient for setting symmetry and/or dimension relationships among conductors in the first sub-conductor pattern layer for communicating the first frequency divider region 101 with the second frequency divider region 102, and for setting symmetry and/or dimension relationships among conductors for communicating the third frequency divider region 103 with the fourth frequency divider region 104. Thus, a time difference of a signal arriving at the first frequency divider region 101, the second frequency divider region 102, the third frequency divider region 103 and the fourth frequency divider region 104 respectively by means of the conductor patterns in the first sub-conductor pattern layer is reduced, thereby reducing delay of the channel to the transmitted signal, and improving efficiency and quality of signal transmission. By providing the second sub-conductor pattern layer to communicate the first frequency divider region 101 with the fourth frequency divider region 104, and to communicate the second frequency divider region 102 with the third frequency divider region 103, it is convenient for setting symmetry and/or dimension relationships among conductors in the second sub-conductor pattern layer for communicating the first frequency divider region 101 with the fourth frequency divider region 104, and for setting symmetry and/or dimension relationships among conductors for communicating the second frequency divider region 102 with the third frequency divider region 103. Thus, a time difference of a signal arriving at the first frequency divider region 101, the second frequency divider region 102, the third frequency divider region 103 and the fourth frequency divider region 104 respectively by means of the conductor patterns in the second sub-conductor pattern layer is reduced, thereby reducing the delay of the channel to the transmitted signal, and improving the efficiency and the quality of signal transmission.

As an example, referring to FIG. 2A, an output terminal YF of the first frequency divider PF1 is connected to a first data input terminal A of the second frequency divider PF2 and a second data input terminal B of the third frequency divider PF3. The output terminal YF of the second frequency divider PF2 is connected to the first data input terminal A of the third frequency divider PF3 and the second data input terminal B of the fourth frequency divider PF4. The output terminal YF of the third frequency divider PF3 is connected to the first data input terminal A of the fourth frequency divider PF4 and the second data input terminal B of the first frequency divider PF1. The output terminal YF of the fourth frequency divider PF4 is connected to the first data input terminal A of the first frequency divider PF1 and the second data input terminal B of the second frequency divider PF2. First clock input terminals WCKT of the first frequency divider PF1, of the second frequency divider PF2, of the third frequency divider PF3 and of the fourth frequency divider PF4 are configured to receive a first clock signal. Second clock input terminals WCKC of the first frequency divider PF1, of the second frequency divider PF2, of the third frequency divider PF3 and of the fourth frequency divider PF4 are configured to receive a second clock signal.

As an example, referring to FIG. 1 and FIG. 2B, a frequency divider structure shown in FIG. 2B may be fabricated by means of the layout structure shown in FIG. 1. The frequency divider structure includes the first frequency divider PF1, the second frequency divider PF2, the third frequency divider PF3 and the fourth frequency divider PF4 arranged centrosymmetrically. The first frequency divider region 101 is configured to form the first frequency divider PF1, the second frequency divider region 102 is configured to form the second frequency divider PF2, the third frequency divider region 103 is configured to form the third frequency divider PF3, and the fourth frequency divider region 104 is configured to form the fourth frequency divider PF4.

As an example, with continued reference to FIG. 1 to FIG. 2B, the first sub-conductor pattern layer includes a first conductor pattern L11, a second conductor pattern L12, a third conductor pattern L13, and a fourth conductor pattern L14. The first conductor pattern L11 communicates the output terminal YF of the first frequency divider PF1 with the first data input terminal A of the second frequency divider PF2. The second conductor pattern L12 is connected to the second data input terminal B of the second frequency divider PF2. The third conductor pattern L13 is connected to the second data input terminal B of the fourth frequency divider PF4. The fourth conductor pattern L14 communicates the output terminal YF of the third frequency divider PF3 with the first data input terminal A of the fourth frequency divider PF4. In this embodiment, by setting symmetry and/or size relationships among the first conductor pattern L11, the second conductor pattern L12, the third conductor pattern L13 and the fourth conductor pattern L14, a time difference of a signal arriving at the first frequency divider region 101, the second frequency divider region 102, the third frequency divider region 103 and the fourth frequency divider region 104 respectively by means of the first conductor pattern L11, the second conductor pattern L12, the third conductor pattern L13 and the fourth conductor pattern L14 is reduced. Because the first frequency divider region 101, the second frequency divider region 102, the third frequency divider region 103 and the fourth frequency divider region 104 are arranged centrosymmetrically, the first frequency divider region 101, the second frequency divider region 102, the third frequency divider region 103 and the fourth frequency divider region 104 may be set to share part of a signal transmission channel. Compared with traditional channel conductors that are independent of one another, there is no channel design with a shared path. Therefore, according to the embodiments of the present disclosure, a total length of the channel is effectively reduced, thereby reducing the delay of the channel to the transmitted signal, and improving the efficiency and the quality of signal transmission.

As an example, with continued reference to FIG. 1, the first conductor pattern L11, the second conductor pattern L12, the third conductor pattern L13 and the fourth conductor pattern L14 are sequentially arranged along a first direction, such as an oy direction. The first conductor pattern L11 and the fourth conductor pattern L14 are arranged centrosymmetrically, and an extension direction of the first conductor pattern L11 is parallel to an extension direction of the fourth conductor pattern L14. The second conductor pattern L12 and the third conductor pattern L13 are arranged centrosymmetrically, and an extension direction of the second conductor pattern L12 is parallel to an extension direction of the third conductor pattern L13. In one example, the first conductor pattern L11, the second conductor pattern L12, the third conductor pattern L13 and the fourth conductor pattern L14 extend along a second direction, such as an ox direction, where the ox direction may be perpendicular to the oy direction. The length of the first conductor pattern L11 and the length of the fourth conductor pattern L14 are greater than the length of the second conductor pattern L12 and the length of the third conductor pattern L13, the length of the first conductor pattern L11 may be equal to the length of the fourth conductor pattern L14, and the length of the second conductor pattern L12 may be equal to the length of the third conductor pattern L13. In this embodiment, the time difference of the signal arriving at a symmetric channel among the first frequency divider region 101, the second frequency divider region 102, the third frequency divider region 103 and the fourth frequency divider region 104 respectively by means of the first conductor pattern L11, the second conductor pattern L12, the third conductor pattern L13 and the fourth conductor pattern L14 is reduced, thereby reducing the length of the channel, avoiding a phenomenon of winding, and improving the efficiency and the quality of signal transmission.

As an example, with continued reference to FIG. 1 to FIG. 2B, the second sub-conductor pattern layer includes a fifth conductor pattern L21, a sixth conductor pattern L22, a seventh conductor pattern L23 and an eighth conductor pattern L24. The fifth conductor pattern L21 communicates the first data input terminal A of the first frequency divider PF1 with the output terminal YF of the fourth frequency divider PF4. The sixth wire pattern L22 is connected to the second data input terminal B of the first frequency divider PF1. The seventh wire pattern L23 is connected to the second data input terminal B of the third frequency divider PF3. The eighth wire pattern L24 communicates the output terminal YF of the second frequency divider PF2 with the first data input terminal A of the third frequency divider PF3. In this embodiment, by setting symmetry and/or dimension relationships among the fifth conductor pattern L21, the sixth conductor pattern L22, the seventh conductor pattern L23 and the eighth conductor pattern L24, a time difference of a signal arriving at the first frequency divider region 101, the second frequency divider region 102, the third frequency divider region 103 and the fourth frequency divider region 104 respectively by means of the fifth conductor pattern L21, the sixth conductor pattern L22, the seventh conductor pattern L23 and the eighth conductor pattern L24 is reduced, thereby reducing the delay of the channel to the transmitted signal, and improving the efficiency and the quality of signal transmission.

As an example, with continued reference to FIG. 1 to FIG. 2B, the fifth conductor pattern L21, the sixth conductor pattern L22, the seventh conductor pattern L23 and the eighth conductor pattern L24 are sequentially arranged along the second direction, such as the ox direction. The fifth conductor pattern L21 and the eighth conductor pattern L24 are arranged centrosymmetrically, and the extension direction of the fifth conductor pattern L21 is parallel to the extension direction of the eighth conductor pattern L24. The sixth conductor pattern L22 and the seventh conductor pattern L23 are arranged centrosymmetrically, and the extension direction of the sixth conductor pattern L22 is parallel to the extension direction of the seventh conductor pattern L23. In one example, the fifth conductor pattern L21, the sixth conductor pattern L22, the seventh conductor pattern L23 and the eighth conductor pattern L24 extend along the first direction, such as the oy direction. The length of the fifth conductor pattern L21 and the length of the eighth conductor pattern L24 are greater than the length of the sixth conductor pattern L22 and the length of the seventh conductor pattern L23. In one example, the length of the fifth conductor pattern L21 is equal to the length of the eighth conductor pattern L24, and the length of the sixth conductor pattern L22 is equal to the length of the seventh conductor pattern L23. In this embodiment, a time difference of a signal arriving at a symmetric channel among the first frequency divider region 101, the second frequency divider region 102, the third frequency divider region 103 and the fourth frequency divider region 104 respectively by means of the fifth conductor pattern L21, the sixth conductor pattern L22, the seventh conductor pattern L23 and the eighth conductor pattern L24 is reduced, thereby reducing the delay of the channel to the transmitted signal, and improving the efficiency and the quality of signal transmission.

As an example, with continued reference to FIG. 1 to FIG. 2B, the conductor pattern layer further includes a third sub-conductor pattern layer stacked. The third sub-conductor pattern layer is connected to the first frequency divider region 101, the second frequency divider region 102, the third frequency divider region 103, and the fourth frequency divider region 104. By setting symmetry and/or dimension relationships among signal lines, in the third sub-conductor pattern layer, connected to the first frequency divider region 101, the second frequency divider region 102, the third frequency divider region 103 and the fourth frequency divider region 104 respectively, channel transmission difference between different frequency dividers in the frequency divider structure is reduced, and a time difference of the first clock signal arriving at the first frequency divider region 101, the second frequency divider region 102, the third frequency divider region 103 and the fourth frequency divider region 104 by means of the third sub-conductor pattern layer is reduced.

As an example, with continued reference to FIG. 1 to FIG. 2B, the third sub-conductor pattern layer includes a first signal line pattern S31, a second signal line pattern S32, a third signal line pattern S33, and a fourth signal line pattern S34. The first signal line pattern S31 and the second signal line pattern S32 are arranged symmetrically, and an extension direction of the first signal line pattern S31 is parallel to an extension direction of the second signal line pattern S32. The third signal line pattern S33 communicates a center point of the first signal line pattern S31 with a center point of the second signal line pattern S32, and an extension direction of the third signal line pattern S33 is perpendicular to the extension direction of the first signal line pattern S31. The fourth signal line pattern S34 is connected to a center point of the third signal line pattern S33, and an extension direction of the fourth signal line pattern S34 is perpendicular to the extension direction of the third signal line pattern S33. In this embodiment, the time difference of the first clock signal arriving at the first frequency divider region 101, the second frequency divider region 102, the third frequency divider region 103 and the fourth frequency divider region 104 by means of the third sub-conductor pattern layer is reduced. The first clock signal arrives at a channel among the first frequency divider region 101, the second frequency divider region 102, the third frequency divider region 103 and the fourth frequency divider region 104 by means of the third sub-conductor pattern layer, where the channel shares the fourth signal line pattern S34 and part of the third signal line pattern S33, thereby reducing the length of the channel, avoiding the phenomenon of winding, reducing the delay of the channel to the transmitted signal, and improving the efficiency and the quality of signal transmission.

As an example, with continued reference to FIG. 1 to FIG. 2B, the conductor pattern layer further includes a fourth sub-conductor pattern layer stacked. The fourth sub-conductor pattern layer is connected to the first frequency divider region 101, the second frequency divider region 102, the third frequency divider region 103, and the fourth frequency divider region 104. By setting symmetry and/or dimension relationships among signal lines, in the fourth sub-conductor pattern layer, connected to the first frequency divider region 101, the second frequency divider region 102, the third frequency divider region 103 and the fourth frequency divider region 104 respectively, the channel transmission difference between different frequency dividers in the frequency divider structure is reduced, and a time difference of the second clock signal arriving at the first frequency divider region 101, the second frequency divider region 102, the third frequency divider region 103 and the fourth frequency divider region 104 by means of the fourth sub-conductor pattern layer is reduced, thereby improving the consistency in receiving the signal and outputting the signal for the first frequency divider PF1, the second frequency divider PF2, the third frequency divider PF3 and the fourth frequency divider PF4, and improving the efficiency and the quality of signal transmission.

As an example, with continued reference to FIG. 1, the fourth sub-conductor pattern layer includes a fifth signal line pattern S41, a sixth signal line pattern S42, a seventh signal line pattern S43, and an eighth signal line pattern S44. The fifth signal line pattern S41 and the sixth signal line pattern S42 are arranged symmetrically, and an extension direction of the fifth signal line pattern S41 is parallel to an extension direction of the sixth signal line pattern S42. The seventh signal line pattern S43 communicates a center point of the fifth signal line pattern S41 with a center point of the sixth signal line pattern S42, and an extension direction of the seventh signal line pattern S43 is perpendicular to the extension of the fifth signal line pattern S41. The eighth signal line pattern S44 is connected to a center point of the seventh signal line pattern S43, and an extension direction of the eighth signal line pattern S44 is perpendicular to the extension direction of the seventh signal line pattern S43. This embodiment reduces the time difference of the second clock signal arriving at the first frequency divider region 101, the second frequency divider region 102, the third frequency divider region 103 and the fourth frequency divider region 104 by means of the fourth sub-conductor pattern layer. The second clock signal arrives at a channel among the first frequency divider region 101, the second frequency divider region 102, the third frequency divider region 103 and the fourth frequency divider region 104 by means of the fourth sub-conductor pattern layer, where the channel shares the eighth signal line pattern S44 and part of the seventh signal line pattern S43, thereby reducing the length of the channel, avoiding the phenomenon of winding, reducing the delay of the channel to the transmitted signal, and improving the efficiency and the quality of signal transmission.

As an example, with continued reference to FIG. 1, at least two of the first sub-conductor pattern layer, the second sub-conductor pattern layer, the third sub-conductor pattern layer and the fourth sub-conductor pattern layer are made of different materials. For example, any two of the first sub-conductor pattern layer, the second sub-conductor pattern layer, the third sub-conductor pattern layer and the fourth sub-conductor pattern layer are made of different materials, such that it is ensured that in the frequency divider structure fabricated by means of the layout structure in the embodiments of the present disclosure, the channel difference between different frequency dividers is within a target accuracy range in combination with the length of a particular channel, to meet application requirements.

Figure 3:
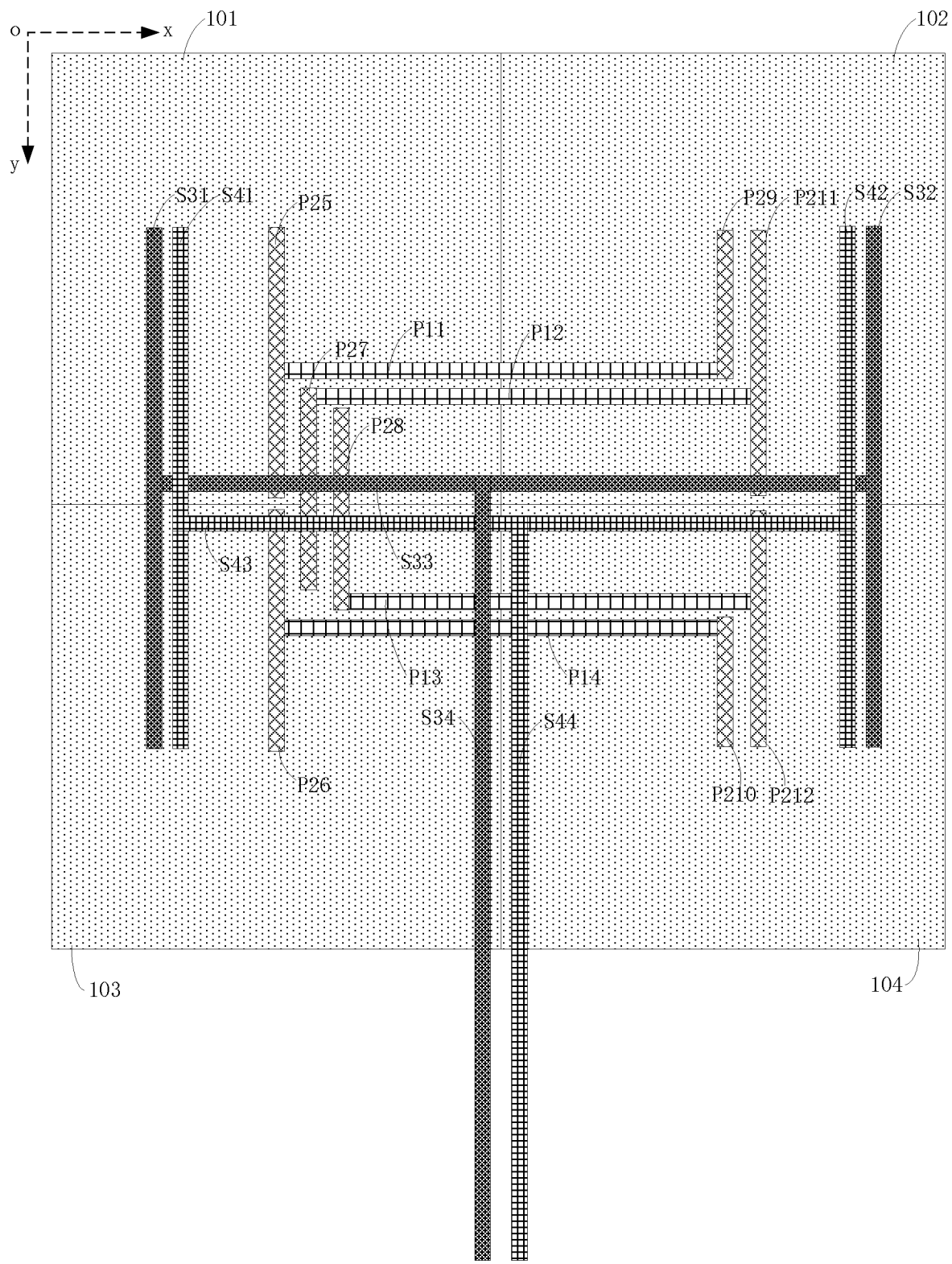
FIG. 3 is a schematic top view of a layout of a frequency divider according to another embodiment of the present disclosure.

As an example, referring to FIG. 3, in an embodiment of the present disclosure, there is provided a layout structure, which includes a frequency divider pattern layer and a conductor pattern layer. The frequency divider pattern layer includes a first frequency divider region 101, a second frequency divider region 102, a third frequency divider region 103 and a fourth frequency divider region 104 arranged centrosymmetrically. The conductor pattern layer includes a first sub-conductor pattern layer and a second sub-conductor pattern layer stacked. The first sub-conductor pattern layer is configured to communicate the first frequency divider region 101 with the second frequency divider region 102, and communicate the third frequency divider region 103 with the fourth frequency divider region 104. The second sub-conductor pattern layer is configured to communicate the first frequency divider region 101 with the third frequency divider region 103, and communicate the second frequency divider region 102 with the fourth frequency divider region 104.

As an example, with continued reference to FIG. 3, the first frequency divider region 101 is configured to form the first frequency divider PF1, the second frequency divider region 102 is configured to form the second frequency divider PF2, the third frequency divider region 103 is configured to form the third frequency divider PF3, and the fourth frequency divider region 104 is configured to form the fourth frequency divider PF4. The first sub-conductor pattern layer includes a first conductor pattern P11, a second conductor pattern P12, a third conductor pattern P13 and a fourth conductor pattern P14 sequentially arranged along the first direction (e.g., the oy direction). The second sub-conductor pattern layer includes a fifth conductor pattern P25, a sixth conductor pattern P26, a seventh conductor pattern P27, an eighth conductor pattern P28, a ninth conductor pattern P29, a tenth conductor pattern P210, an eleventh conductor pattern P211, and a twelfth conductor pattern P212. A terminal of the first conductor pattern P11 communicates the fifth conductor pattern P25, and other terminal of the first conductor pattern P11 communicates the ninth conductor pattern P29, to form, for example, an "h" shape. A terminal of the second conductor pattern P12 communicates the seventh conductor pattern 27, and other terminal of the second conductor pattern P12 communicates the eleventh conductor pattern P211, to form, for example, the "h" shape. A terminal of the third conductor pattern P13 communicates the eighth conductor pattern P28, and other terminal of the third conductor pattern P13 communicates the twelfth conductor pattern P212, to form, for example, the "h" shape. A terminal of the fourth conductor pattern P14 communicates the sixth conductor pattern P26, and other terminal of the fourth conductor pattern P14 communicates the tenth conductor pattern P210, to form, for example, the "h" shape. In this embodiment, the load difference between the four "h" shaped channels is within a target load difference accuracy range. In one example, the length difference between any two of the seventh conductor pattern P27, the eighth conductor pattern P28, the ninth conductor pattern P29 and the tenth conductor pattern P210 is within a second preset accuracy range. In one example, the seventh conductor pattern P27, the eighth conductor pattern P28, the ninth conductor pattern P29, and the tenth conductor pattern P210 have the equal length.

As an example, with continued reference to FIG. 3, the first frequency divider region 101 may be provided to form a first frequency divider PF1, the second frequency divider region 102 may be provided to form a second frequency divider PF2, the third frequency divider region 103 may be provided to form a third frequency divider PF3, and the fourth frequency divider region 104 may be provided to form a fourth frequency divider PF4. By providing the first frequency divider region 101, the second frequency divider region 102, the third frequency divider region 103 and the fourth frequency divider region 104 to be arranged centrosymmetrically, it is convenient for the first frequency divider PF1, the second frequency divider PF2, the third frequency divider PF3 and the fourth frequency divider PF4 fabricated subsequently to be centrosymmetric, thereby reducing a channel difference among the first frequency divider PF1, the second frequency divider PF2, the third frequency divider PF3 and the fourth frequency divider PF4. By providing the first sub-conductor pattern layer to communicate the first frequency divider region 101 with the second frequency divider region 102, and to communicate the third frequency divider region 103 with the fourth frequency divider region 104, it is convenient for setting symmetry and/or dimension relationships among conductors in the first sub-conductor pattern layer for communicating the first frequency divider region 101 with the second frequency divider region 102, and for setting symmetry and/or dimension relationships among conductors for communicating the third frequency divider region 103 with the fourth frequency divider region 104. Thus, a time difference of a signal arriving at the first frequency divider region 101, the second frequency divider region 102, the third frequency divider region 103 and the fourth frequency divider region 104 respectively by means of the conductor patterns in the first sub-conductor pattern layer is reduced, thereby reducing delay of the channel to the transmitted signal, and improving efficiency and quality of signal transmission. By providing the second sub-conductor pattern layer to communicate the first frequency divider region 101 with the third frequency divider region 103, and to communicate the second frequency divider region 102 with the fourth frequency divider region 104, it is convenient for setting symmetry and/or dimension relationships among conductors in the second sub-conductor pattern layer for communicating the first frequency divider region 101 with the third frequency divider region 103, and for setting symmetry and/or dimension relationships among conductors for communicating the second frequency divider region 102 with the fourth frequency divider region 104. Thus, a time difference of a signal arriving at the first frequency divider region 101, the second frequency divider region 102, the third frequency divider region 103 and the fourth frequency divider region 104 respectively by means of the conductor patterns in the second sub-conductor pattern layer is reduced, thereby reducing the delay of the channel to the transmitted signal, and improving the efficiency and the quality of signal transmission.

As an example, with continued reference to FIGS. 2a to 3, the output terminal YF of the first frequency divider PF1 is connected to the first data input terminal A of the second frequency divider PF2 by means of the fifth conductor pattern P25, the first conductor pattern P11 and the ninth conductor pattern P29 in sequence. The second data input terminal B of the second frequency divider PF2 is connected to the first data input terminal A of the first frequency divider PF1 by means of the eleventh conductor pattern P211, the second conductor pattern P12 and the seventh conductor pattern P27 in sequence. The output terminal YF of the third frequency divider PF3 is connected to the first data input terminal A of the fourth frequency divider PF4 by means of the sixth conductor pattern P26, the fourth conductor pattern P14 and the tenth conductor pattern P210 in sequence. The second data input terminal B of the fourth frequency divider PF4 is connected to the first data input terminal A of the third frequency divider PF3 by means of the twelfth conductor pattern P212, the third conductor pattern P13 and the eighth conductor pattern P28 in sequence. A length difference between a communication path between the first frequency divider PF1 and the second frequency divider PF2 and a communication path between the third frequency divider PF3 and the fourth frequency divider PF4 is within a first preset accuracy range. In this way, channel transmission difference between different frequency dividers in the frequency divider structure can be reduced, and consistency in receiving the signal and outputting the signal can be improved for the different frequency dividers in the frequency divider structure, thereby improving the efficiency and the quality of signal transmission.

As an example, with continued reference to FIG. 3, the extension direction of at least one conductor pattern in the first sub-conductor pattern layer is perpendicular to the extension direction of at least one conductor pattern in the second sub-conductor pattern layer. For example, the extension direction of each conductor pattern in the first sub-conductor pattern layer is perpendicular to the extension direction of any one conductor pattern in the second sub-conductor pattern layer, thereby improving symmetry of the layout, reducing complexity of the layout structure, reducing production costs, and improving reliability of the frequency divider structure.

As an example, with continued reference to FIGS. 2a to 3, the output terminal YF of the first frequency divider PF1 is connected to the second data input terminal B of the third frequency divider PF3 by means of the fifth conductor pattern P25. The output terminal YF of the third frequency divider PF3 is connected to the second data input terminal B of the first frequency divider PF1 by means of the sixth conductor pattern P26. The output terminal YF of the second frequency divider PF2 is connected to the second data input terminal B of the fourth frequency divider PF4 by means of the eleventh conductor pattern P211. The output terminal YF of the fourth frequency divider PF4 is connected to the second data input terminal B of the second frequency divider PF2 by means of the twelfth conductor pattern P212. A length difference between any two of the fifth conductor pattern P25, the sixth conductor pattern P26, the eleventh conductor pattern P211 and the twelfth conductor pattern P212 is within a second preset accuracy range. In one example, the fifth conductor pattern P25, the sixth conductor pattern P26, the eleventh conductor pattern P211 and the twelfth conductor pattern P212 have the same length. In this embodiment, the time difference of the signal arriving at the first frequency divider region 101, the second frequency divider region 102, the third frequency divider region 103 and the fourth frequency divider region 104 respectively by means of the conductor patterns in the second sub-conductor pattern layer is reduced, thereby reducing the delay of the channel to the transmitted signal, and improving the efficiency and the quality of signal transmission.

As an example, with continued reference to FIG. 3, the first conductor pattern P11 and the fourth conductor pattern P14 are arranged symmetrically along the first direction, and the second conductor pattern P12 and the third conductor pattern P13 are arranged symmetrically along the first direction, to reduce the complexity of the layout structure, reduce the production costs, improve the reliability of the frequency divider structure.

As an example, with continued reference to FIG. 3, the first conductor patterns P11 and the fourth conductor patterns P14 are arranged centrosymmetrically, and the second conductor patterns P12 and the third conductor patterns P13 are arranged centrosymmetrically. In one example, the first conductor pattern P11, the second conductor pattern P12, the third conductor pattern P13 and the fourth conductor pattern P14 are arranged at intervals along the first direction (e.g., the oy direction), and extend along the second direction (e.g., the ox direction)), where the ox direction may be perpendicular to the oy direction. In one example, the first conductor pattern P11, the second conductor pattern P12, the third conductor pattern P13 and the fourth conductor pattern P14 may be equal in length. This embodiment improves the symmetry of the layout, reduces the complexity of the layout structure, reduces the production costs, and improves the reliability of the frequency divider structure.

As an example, with continued reference to FIG. 3, the fifth conductor pattern P25 and the sixth conductor pattern P26 are arranged symmetrically along the second direction; the eleventh conductor pattern P211 and the twelfth conductor pattern P212 are arranged symmetrically along the second direction; and/or the ninth conductor pattern P29 and the tenth conductor pattern P210 are arranged symmetrically along the second direction, to reduce the complexity of the layout structure, reduce the production costs, and improves the reliability of the frequency divider structure.

As an example, with continued reference to FIG. 3, the conductor pattern layer further includes a third sub-conductor pattern layer stacked. The third sub-conductor pattern layer is connected to the first frequency divider region 101, the second frequency divider region 102, the third frequency divider region 103, and the fourth frequency divider region 104. By setting symmetry and/or dimension relationships among signal lines, in the third sub-conductor pattern layer, connected to the first frequency divider region 101, the second frequency divider region 102, the third frequency divider region 103 and the fourth frequency divider region 104 respectively, the channel transmission difference between different frequency dividers in the frequency divider structure is reduced, and a time difference of the first clock signal arriving at the first frequency divider region 101, the second frequency divider region 102, the third frequency divider region 103 and the fourth frequency divider region 104 by means of the third sub-conductor pattern layer is reduced, thereby improving the consistency in receiving the signal and outputting the signal for the first frequency divider PF1, the second frequency divider PF2, the third frequency divider PF3 and the fourth frequency divider PF4, and improving the efficiency and the quality of signal transmission.

As an example, with continued reference to FIG. 3, the third sub-conductor pattern layer includes a first signal line pattern S31, a second signal line pattern S32, a third signal line pattern S33, and a fourth signal line pattern S34. The first signal line pattern S31 and the second signal line pattern S32 are arranged symmetrically, and an extension direction of the first signal line pattern S31 is parallel to an extension direction of the second signal line pattern S32. The third signal line pattern S33 communicates a center point of the first signal line pattern S31 with a center point of the second signal line pattern S32, and an extension direction of the third signal line pattern S33 is perpendicular to the extension direction of the first signal line pattern S31. The fourth signal line pattern S34 is connected to a center point of the third signal line pattern S33, and an extension direction of the fourth signal line pattern S34 is perpendicular to the extension direction of the third signal line pattern S33. In this embodiment, the time difference of the first clock signal arriving at the first frequency divider region 101, the second frequency divider region 102, the third frequency divider region 103 and the fourth frequency divider region 104 by means of the third sub-conductor pattern layer is reduced. The first clock signal arrives at a channel among the first frequency divider region 101, the second frequency divider region 102, the third frequency divider region 103 and the fourth frequency divider region 104 by means of the third sub-conductor pattern layer, where the channel shares the fourth signal line pattern S34 and part of the third signal line pattern S33, thereby reducing the length of the channel, avoiding the phenomenon of winding, reducing the delay of the channel to the transmitted signal, and improving the efficiency and the quality of signal transmission.

As an example, with continued reference to FIG. 3 to FIG. 2B, the conductor pattern layer further includes a fourth sub-conductor pattern layer stacked. The fourth sub-conductor pattern layer is connected to the first frequency divider region 101, the second frequency divider region 102, the third frequency divider region 103, and the fourth frequency divider region 104. By setting symmetry and/or dimension relationships among signal lines, in the fourth sub-conductor pattern layer, connected to the first frequency divider region 101, the second frequency divider region 102, the third frequency divider region 103 and the fourth frequency divider region 104 respectively, the channel transmission difference between different frequency dividers in the frequency divider structure is reduced, and a time difference of the second clock signal arriving at the first frequency divider region 101, the second frequency divider region 102, the third frequency divider region 103 and the fourth frequency divider region 104 by means of the fourth sub-conductor pattern layer is reduced, thereby improving the consistency in receiving the signal and outputting the signal for the first frequency divider PF1, the second frequency divider PF2, the third frequency divider PF3 and the fourth frequency divider PF4, and improving the efficiency and the quality of signal transmission.

As an example, with continued reference to FIG. 3, the fourth sub-conductor pattern layer includes a fifth signal line pattern S41, a sixth signal line pattern S42, a seventh signal line pattern S43, and an eighth signal line pattern S44. The fifth signal line pattern S41 and the sixth signal line pattern S42 are arranged symmetrically, and an extension direction of the fifth signal line pattern S41 is parallel to an extension direction of the sixth signal line pattern S42. The seventh signal line pattern S43 communicates a center point of the fifth signal line pattern S41 with a center point of the sixth signal line pattern S42, and an extension direction of the seventh signal line pattern S43 is perpendicular to the extension of the fifth signal line pattern S41. The eighth signal line pattern S44 is connected to a center point of the seventh signal line pattern S43, and an extension direction of the eighth signal line pattern S44 is perpendicular to the extension direction of the seventh signal line pattern S43. In this embodiment, the time difference of the second clock signal arriving at the first frequency divider region 101, the second frequency divider region 102, the third frequency divider region 103 and the fourth frequency divider region 104 by means of the fourth sub-conductor pattern layer is reduced. The second clock signal arrives at a channel among the first frequency divider region 101, the second frequency divider region 102, the third frequency divider region 103 and the fourth frequency divider region 104 by means of the fourth sub-conductor pattern layer, where the channel shares the fourth signal line pattern S34 and part of the third signal line pattern S33, thereby reducing the length of the channel, avoiding the phenomenon of winding, reducing the delay of the channel to the transmitted signal, and improving the efficiency and the quality of signal transmission.

Figure 4:
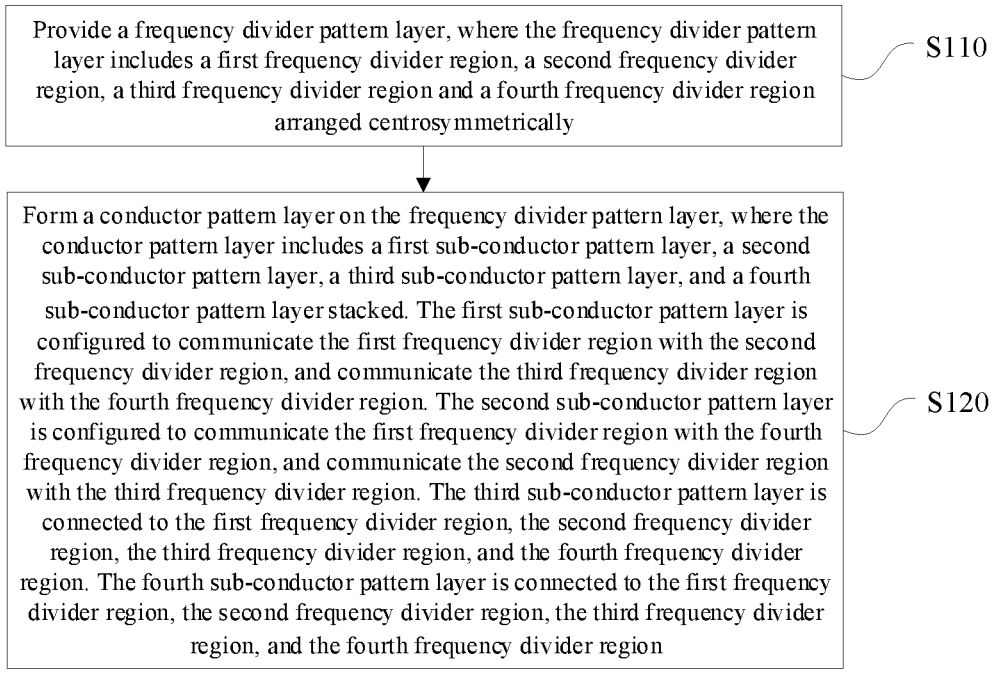
FIG. 4 is a schematic flowchart of a method for fabricating a layout of a frequency divider according to an embodiment of the present disclosure.

As an example, referring to FIG. 4, in an embodiment of the present disclosure, a method for fabricating a layout structure is provided, and the method includes following steps:

Step S110: providing a frequency divider pattern layer, where the frequency divider pattern layer includes a first frequency divider region, a second frequency divider region, a third frequency divider region and a fourth frequency divider region arranged centrosymmetrically; and Step S120: forming a conductor pattern layer on the frequency divider pattern layer, where the conductor pattern layer includes a first sub-conductor pattern layer and a second sub-conductor pattern layer stacked. The first sub-conductor pattern layer is configured to communicate the first frequency divider region with the second frequency divider region, and communicate the third frequency divider region with the fourth frequency divider region. The second sub-conductor pattern layer is configured to communicate the first frequency divider region with the fourth frequency divider region, and communicate the second frequency divider region with the third frequency divider region.

Figure 5:
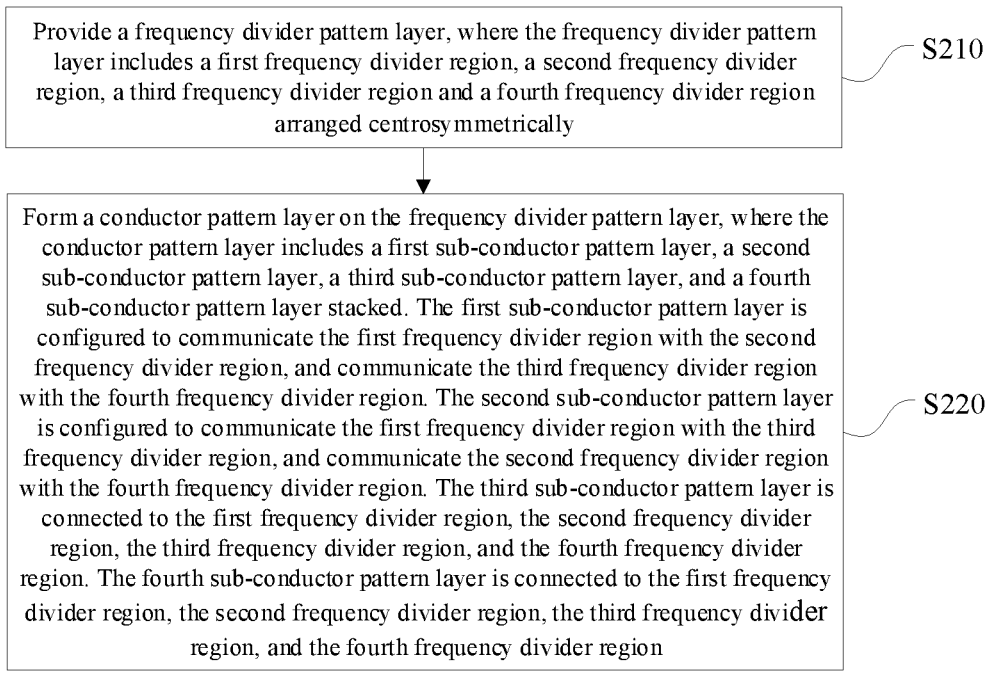
FIG. 5 is a schematic flowchart of a method for fabricating a layout of a frequency divider according to another embodiment of the present disclosure.

As an example, referring to FIG. 5, in an embodiment of the present disclosure, a method for fabricating a layout structure is provided, and the method includes following steps:

Step S210: providing a frequency divider pattern layer, where the frequency divider pattern layer includes a first frequency divider region, a second frequency divider region, a third frequency divider region and a fourth frequency divider region arranged centrosymmetrically; and Step S220: forming a conductor pattern layer on the frequency divider pattern layer, where the conductor pattern layer includes a first sub-conductor pattern layer and a second sub-conductor pattern layer stacked. The first sub-conductor pattern layer is configured to communicate the first frequency divider region with the second frequency divider region, and communicate the third frequency divider region with the fourth frequency divider region. The second sub-conductor pattern layer is configured to communicate the first frequency divider region with the third frequency divider region, and communicate the second frequency divider region with the fourth frequency divider region.

Reference may be made to limitations on the layout structure in the foregoing embodiments for limitations on the method for fabricating the layout structure, which are not to be described in detail here.

It is to be noted that the above embodiments are intended for purposes of illustration only and are not intended to limit the embodiments of the present disclosure.

It should be understood that unless expressly stated herein, the execution of these steps is not strictly limited in sequence, and these steps may be performed in other orders. Moreover, at least some of the steps may include a plurality of sub-steps or a plurality of stages, which are not necessarily performed at the same moment, but may be executed at different moments, and the order of execution of these sub-steps or stages is not necessarily performed sequentially, but may be performed alternately or alternately with at least a portion of the sub-steps or stages of other steps or other steps.

The embodiments in the specification are described in a progressive manner. Each embodiment is focused on difference from other embodiments. And cross reference is available for identical or similar parts among different embodiments.

Technical features of the above embodiments may be arbitrarily combined. For simplicity, all possible combinations of the technical features in the above embodiments are not described. However, as long as the combination of these technical features is not contradictory, it shall be deemed to be within the scope recorded in this specification.

The above embodiments merely express several implementations of the embodiments of the present disclosure, and descriptions thereof are relatively concrete and detailed. However, these embodiments are not thus construed as limiting the patent scope of the embodiments of the present disclosure. It is to be pointed out that for persons of ordinary skill in the art, some modifications and improvements may be made under the premise of not departing from a conception of the embodiments of the present disclosure, which shall be regarded as falling within the scope of protection of the embodiments of the present disclosure. Thus, patent protection scope of the embodiments of the present disclosure shall be subject to the appended claims.

What is claimed is:

1. A layout structure, comprising:
a frequency divider pattern layer comprising a first frequency divider region, a second frequency divider region, a third frequency divider region and a fourth frequency divider region arranged centrosymmetrically; and
a conductor pattern layer formed on the frequency divider pattern layer, the conductor pattern layer comprising a first sub-conductor pattern layer and a second sub-conductor pattern layer stacked;
wherein the first sub-conductor pattern layer is configured to communicate the first frequency divider region with the second frequency divider region, and communicate the third frequency divider region with the fourth frequency divider region; and
the second sub-conductor pattern layer is configured to communicate the first frequency divider region with the fourth frequency divider region, and communicate the second frequency divider region with the third frequency divider region;
the first frequency divider region is configured to form a first frequency divider, the second frequency divider region is configured to form a second frequency divider, the third frequency divider region is configured to form a third frequency divider, and the fourth frequency divider region is configured to form a fourth frequency divider; and
the first sub-conductor pattern layer comprises a first conductor pattern, a second conductor pattern, a third conductor pattern, and a fourth conductor pattern,
wherein the first conductor pattern communicates an output terminal of the first frequency divider with a first data input terminal of the second frequency divider;
the second conductor pattern is connected to a second data input terminal of the second frequency divider;
the third conductor pattern is connected to a second data input terminal of the fourth frequency divider; and
the fourth conductor pattern communicates an output terminal of the third frequency divider with a first data input terminal of the fourth frequency divider.

2. The layout structure according to claim 1, wherein the first conductor pattern, the second conductor pattern, the third conductor pattern and the fourth conductor pattern are sequentially arranged along a first direction; the first conductor pattern and the fourth conductor pattern are arranged centrosymmetrically, an extension direction of the first conductor pattern being parallel to an extension direction of the fourth conductor pattern;

the second conductor pattern and the third conductor pattern are arranged centrosymmetrically, an extension direction of the second conductor pattern being parallel to an extension direction of the third conductor pattern; and a length of the first conductor pattern is greater than a length of the second conductor pattern.

3. The layout structure according to claim 1, wherein the second sub-conductor pattern layer comprises a fifth conductor pattern, a sixth conductor pattern, a seventh conductor pattern, and an eighth conductor pattern;

wherein the fifth conductor pattern communicates a first data input terminal of the first frequency divider with an output terminal of the fourth frequency divider;

the sixth conductor pattern is connected to a second data input terminal of the first frequency divider;

the seventh conductor pattern is connected to a second data input terminal of the third frequency divider; and the eighth conductor pattern communicates an output terminal of the second frequency divider with a first data input terminal of the third frequency divider.

4. The layout structure according to claim 3, wherein the fifth conductor pattern, the sixth conductor pattern, the seventh conductor pattern and the eighth conductor pattern are sequentially arranged along a second direction;

the fifth conductor pattern and the eighth conductor pattern are arranged centrosymmetrically, an extension direction of the fifth conductor pattern being parallel to an extension direction of the eighth conductor pattern;

the sixth conductor pattern and the seventh conductor pattern are arranged centrosymmetrically, an extension direction of the sixth conductor pattern being parallel to an extension direction of the seventh conductor pattern; and a length of the fifth conductor pattern is greater than a length of the sixth conductor pattern.

5. The layout structure according to claim 1, wherein the conductor pattern layer further comprises a third sub-conductor pattern layer stacked, the third sub-conductor pattern layer being connected to the first frequency divider region, the second frequency divider region, the third frequency divider region, and the fourth frequency divider region.

6. The layout structure according to claim 5, wherein the third sub-conductor pattern layer comprises a first signal line pattern, a second signal line pattern, a third signal line pattern, and a fourth signal line pattern;

wherein the first signal line pattern and the second signal line pattern are arranged symmetrically, an extension direction of the first signal line pattern being parallel to an extension direction of the second signal line pattern;

the third signal line pattern communicates a center point of the first signal line pattern with a center point of the second signal line pattern, an extension direction of the third signal line pattern being perpendicular to the extension direction of the first signal line pattern; and the fourth signal line pattern is connected to a center point of the third signal line pattern, an extension direction of the fourth signal line pattern being perpendicular to the extension direction of the third signal line pattern.

7. The layout structure according to claim 1, wherein the conductor pattern layer further comprises a fourth sub-conductor pattern layer stacked, the fourth sub-conductor pattern layer being connected to the first frequency divider region, the second frequency divider region, the third frequency divider region, and the fourth frequency divider region.

8. The layout structure according to claim 7, wherein the fourth sub-conductor pattern layer comprises a fifth signal line pattern, a sixth signal line pattern, a seventh signal line pattern, and an eighth signal line pattern;

wherein the fifth signal line pattern and the sixth signal line pattern are arranged symmetrically, an extension direction of the fifth signal line pattern being parallel to an extension direction of the sixth signal line pattern;

the seventh signal line pattern communicates a center point of the fifth signal line pattern with a center point of the sixth signal line pattern, an extension direction of the seventh signal line pattern being perpendicular to the extension of the fifth signal line pattern; and the eighth signal line pattern is connected to a center point of the seventh signal line pattern, an extension direction of the eighth signal line pattern being perpendicular to the extension direction of the seventh signal line pattern.

9. A layout structure, comprising:

a frequency divider pattern layer comprising a first frequency divider region, a second frequency divider region, a third frequency divider region and a fourth frequency divider region arranged centrosymmetrically; and a conductor pattern layer comprising a first sub-conductor pattern layer and a second sub-conductor pattern layer stacked;

wherein the first sub-conductor pattern layer is configured to communicate the first frequency divider region with the second frequency divider region, and communicate the third frequency divider region with the fourth frequency divider region; and the second sub-conductor pattern layer is configured to communicate the first frequency divider region with the third frequency divider region, and communicate the second frequency divider region with the fourth frequency divider region; and the first frequency divider region is configured to form a first frequency divider, the second frequency divider region is configured to form a second frequency divider, the third frequency divider region is configured to form a third frequency divider, and the fourth frequency divider region is configured to form a fourth frequency divider;

the first sub-conductor pattern layer comprises a first conductor pattern, a second conductor pattern, a third conductor pattern and a fourth conductor pattern sequentially arranged along a first direction; and the second sub-conductor pattern layer comprises a fifth conductor pattern, a sixth conductor pattern, a seventh conductor pattern, an eighth conductor pattern, a ninth conductor pattern, a tenth conductor pattern, an eleventh conductor pattern, and a twelfth conductor pattern, wherein wherein a terminal of the first conductor pattern communicates the fifth conductor pattern, and other terminal of the first conductor pattern communicates the ninth conductor pattern;

a terminal of the second conductor pattern communicates the seventh conductor pattern, and other terminal of the second conductor pattern communicates the eleventh conductor pattern;

a terminal of the third conductor pattern communicates the eighth conductor pattern, and other terminal of the third conductor pattern communicates the twelfth conductor pattern; and a terminal of the fourth conductor pattern communicates the sixth conductor pattern, and other terminal of the fourth conductor pattern communicates the tenth conductor pattern.

10. The layout structure according to claim 9, wherein an output terminal of the first frequency divider is connected to a first data input terminal of the second frequency divider by means of the fifth conductor pattern, the first conductor pattern and the ninth conductor pattern in sequence;

a second data input terminal of the second frequency divider is connected to a first data input terminal of the first frequency divider by means of the eleventh conductor pattern, the second conductor pattern and the seventh conductor pattern in sequence;

an output terminal of the third frequency divider is connected to a first data input terminal of the fourth frequency divider by means of the sixth conductor pattern, the fourth conductor pattern and the tenth conductor pattern in sequence;

a second data input terminal of the fourth frequency divider is connected to a first data input terminal of the third frequency divider by means of the twelfth conductor pattern, the third conductor pattern and the eighth conductor pattern in sequence; and a length difference between a communication path between the first frequency divider and the second frequency divider and a communication path between the third frequency divider and the fourth frequency divider is within a first preset accuracy range.

11. The layout structure according to claim 10, wherein the output terminal of the first frequency divider is connected to a second data input terminal of the third frequency divider by means of the fifth conductor pattern;

the output terminal of the third frequency divider is connected to a second data input terminal of the first frequency divider by means of the sixth conductor pattern;

an output terminal of the second frequency divider is connected to the second data input terminal of the fourth frequency divider by means of the eleventh conductor pattern;

an output terminal of the fourth frequency divider is connected to the second data input terminal of the second frequency divider by means of the twelfth conductor pattern; and a length difference between any two of the fifth conductor pattern, the sixth conductor pattern, the eleventh conductor pattern and the twelfth conductor pattern is within a second preset accuracy range.

12. The layout structure according to claim 9, wherein the first conductor pattern and the fourth conductor pattern are arranged symmetrically along the first direction; and the second conductor pattern and the third conductor pattern are arranged symmetrically along the first direction.

13. The layout structure according to claim 9, wherein the fifth conductor pattern and the sixth conductor pattern are arranged symmetrically along a second direction;

the eleventh conductor pattern and the twelfth conductor pattern are arranged symmetrically along the second direction; and/or the ninth conductor pattern and the tenth conductor pattern are arranged symmetrically along the second direction.

14. The layout structure according to claim 9, wherein the conductor pattern layer further comprises a third sub-conductor pattern layer stacked, the third sub-conductor pattern layer being connected to the first frequency divider region, the second frequency divider region, the third frequency divider region, and the fourth frequency divider region.

15. The layout structure according to claim 14, wherein the third sub-conductor pattern layer comprises a first signal line pattern, a second signal line pattern, a third signal line pattern, and a fourth signal line pattern;

wherein the first signal line pattern and the second signal line pattern are arranged symmetrically, an extension direction of the first signal line pattern being parallel to an extension direction of the second signal line pattern;

the third signal line pattern communicates a center point of the first signal line pattern with a center point of the second signal line pattern, an extension direction of the third signal line pattern being perpendicular to the extension direction of the first signal line pattern; and the fourth signal line pattern is connected to a center point of the third signal line pattern, an extension direction of the fourth signal line pattern being perpendicular to the extension direction of the third signal line pattern.

16. The layout structure according to claim 9, wherein the conductor pattern layer further comprises a fourth sub-conductor pattern layer stacked, the fourth sub-conductor pattern layer being connected to the first frequency divider region, the second frequency divider region, the third frequency divider region, and the fourth frequency divider region.

17. The layout structure according to claim 16, wherein the fourth sub-conductor pattern layer comprises a fifth signal line pattern, a sixth signal line pattern, a seventh signal line pattern, and an eighth signal line pattern;

wherein the fifth signal line pattern and the sixth signal line pattern are arranged symmetrically, an extension direction of the fifth signal line pattern being parallel to an extension direction of the sixth signal line pattern;

the seventh signal line pattern communicates a center point of the fifth signal line pattern with a center point of the sixth signal line pattern, an extension direction of the seventh signal line pattern being perpendicular to the extension of the fifth signal line pattern; and the eighth signal line pattern is connected to a center point of the seventh signal line pattern, an extension direction of the eighth signal line pattern being perpendicular to the extension direction of the seventh signal line pattern.

18. A method for fabricating a layout structure, comprising:

providing a frequency divider pattern layer, wherein the frequency divider pattern layer comprises a first frequency divider region, a second frequency divider region, a third frequency divider region and a fourth frequency divider region arranged centrosymmetrically; and forming a conductor pattern layer on the frequency divider pattern layer, wherein the conductor pattern layer comprises a first sub-conductor pattern layer and a second sub-conductor pattern layer stacked;

wherein the first sub-conductor pattern layer is configured to communicate the first frequency divider region with the second frequency divider region, and communicate the third frequency divider region with the fourth frequency divider region;

the second sub-conductor pattern layer is configured to communicate the first frequency divider region with the fourth frequency divider region, and communicate the second frequency divider region with the third frequency divider region; or, the second sub-conductor pattern layer is configured to communicate the first frequency divider region with the third frequency divider region, and communicate the second frequency divider region with the fourth frequency divider region;

the first frequency divider region is configured to form a first frequency divider, the second frequency divider region is configured to form a second frequency divider, the third frequency divider region is configured to form a third frequency divider, and the fourth frequency divider region is configured to form a fourth frequency divider; and the first sub-conductor pattern layer comprises a first conductor pattern, a second conductor pattern, a third conductor pattern, and a fourth conductor pattern, wherein the first conductor pattern communicates an output terminal of the first frequency divider with a first data input terminal of the second frequency divider;

the second conductor pattern is connected to a second data input terminal of the second frequency divider;

the third conductor pattern is connected to a second data input terminal of the fourth frequency divider; and the fourth conductor pattern communicates an output terminal of the third frequency divider with a first data input terminal of the fourth frequency divider.

* * * * *